(12) United States Patent
Takamori et al.

(10) Patent No.: US 6,451,515 B2
(45) Date of Patent: *Sep. 17, 2002

(54) SUBSTRATE TREATING METHOD

(75) Inventors: Hideyuki Takamori; Kiyohisa Tateyama; Kengo Mizosaki; Noriyuki Anai; Yoshitaka Matsuda, all of Kumamoto-ken (JP)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/366,960

(22) Filed: Aug. 4, 1999

(30) Foreign Application Priority Data

Aug. 5, 1998 (JP) ............................................. 10-233595

(51) Int. Cl.$^7$ ................................................. G03F 7/38
(52) U.S. Cl. ....................................... 430/330; 430/327
(58) Field of Search ................................. 430/327, 330

(56) References Cited

U.S. PATENT DOCUMENTS 4,734,476 A * 3/1988 Sato et al. ................... 526/307
5,688,628 A * 11/1997 Oie et al. .................... 430/176
5,962,149 A * 10/1999 Kronzer ..................... 428/537.5
5,994,425 A * 11/1999 Narang et al. ................. 522/35
6,007,922 A * 12/1999 Sue et al. .................... 428/561
6,045,856 A *  4/2000 Torioshi et al. ................ 427/96
6,060,124 A *  5/2000 Ikegawa et al. ............... 427/379
6,126,580 A * 12/2000 Matsuoka et al. ......... 430/283.1

FOREIGN PATENT DOCUMENTS

JP          07-201724          8/1985

* cited by examiner

Primary Examiner—Hoa Van Le
(74) Attorney, Agent, or Firm—Rader, Fishman & Grauer PLLC

(57) ABSTRACT

A substrate coated with a coating solution, for example, a resist solution is heated at a predetermined temperature, thereafter putted in a non-heated state, and then heated at a second predetermined temperature. Alternatively, a heating process in which a substrate coated with a resist solution is heated and a non-heated process in which the substrate is putted in a non-heated state are repeated a plurality of times. The adoption of the above treating methods can prevent the occurrence of transfer which is an index of ununiformity of film thickness of a resist solution and the like and change in line width of a circuit pattern, thus improving yield in substrate treatment.

10 Claims, 14 Drawing Sheets

SUBSTRATE TREATING METHOD

FIELD OF THE INVENTION

The present invention relates to a substrate treating method for drying a coating solution on a substrate by heating when predetermined treatment is performed for the substrate coated with the coating solution such as an LCD substrate, a semiconductor wafer or the like.

BACKGROUND OF THE INVENTION

In the fabrication of a liquid-crystal display (LCD), for example, a circuit pattern is formed by so-called photolithography technology in which a rectangular glass LCD substrate (referred to as a substrate hereinafter) is coated with a coating solution such as a photo-resist solution to form a resist film and in which the resist film is exposed correspondingly to the circuit pattern and developed.

In the process of coating a resist solution, in order to enhance the fixedness of the resist, the rectangular substrate is given hydrophobic treatment in an adhesion treating unit and cooled in a cooling unit, and then carried in a resist coating unit.

In the resist coating unit, while the rectangular substrate is rotated in the state of being held on a spin chuck, a resist solution is supplied to the central portion of the surface of the substrate from a nozzle provided above the central portion and spread by centrifugal force due to the rotation of the substrate, whereby the entire surface of the substrate is coated with a resist film.

After an excess resist at the periphery of the substrate is removed, the substrate coated with the resist solution is carried in a heating unit to undergo pre-baking treatment. In the heating unit, in order to prevent direct contact of a heating plate and the substrate, a so-called proximity type is often adopted in which the substrate received by lifting pins is mounted on securing pins of the heating plate and heated by heat radiated from the heating plate.

Subsequently, the substrate is cooled in a cooling unit and carried to an aligner where a predetermined pattern is exposed. Thereafter, the substrate is developed and given post-baking treatment, thereby forming a predetermined resist pattern.

In the above coating and developing unit, however, there are some cases where shapes of the lifting pins, securing pins, vacuum grooves, or the like are transferred to the substrate after the substrate coated with the resist solution receives pre-baking treatment and the like, or after the substrate is exposed and developed.

The transfer of the lifting pins and the like is caused specifically by the film thickness of the resist solution coated on the substrate being changed correspondingly to the shapes of the lifting pins and the like after pre-baking treatment, and by the line width of the circuit pattern formed on the substrate being changed according to the shapes of the lifting pins and the like after exposure and development. Even when no transfer is found after pre-baking treatment, there are cases where transfer occurs after development.

It is supposed that such transfer is caused by a sensitized resist solution being used recently and by the line width of a circuit pattern formed on an LCD substrate being 3 $\mu$m which is smaller than ever, but the cause thereof is not determined in detail. Hence, success is not achieved yet in preventing such transfer.

As described above, however, such transfer of the lifting pins and the like corresponds to the ununiformity of the film thickness of the resist solution and a change in line width of the circuit pattern. Thus, it is requested to prevent to the utmost such transfer from occurring on the substrate in the coating and developing process of the LCD substrate.

SUMMARY OF THE INVENTION

The present invention is made in view of the aforesaid disadvantage, and its object is to provide a substrate treating method capable of preventing transfer which is indexes of ununiformity of film thickness of a resist solution and change in line width of a circuit pattern.

In order to solve the above disadvantage, according to the first aspect of the present invention, a substrate treating method for performing predetermined treatment for a substrate coated with a coating solution including the steps of (a) heating the substrate coated with the coating solution at a first predetermined temperature, (b) lowering the temperature of the substrate by positively cooling the substrate and/or by naturally releasing the heat thereof after the step (a), and (c) heating the substrate at a second predetermined temperature after the step (b) is provided.

In the non-heated step (b) in the substrate treating method according to the first aspect, it is possible that the substrate is carried out of a heating unit, that is, the temperature of the substrate is lowered by natural heat release and/or that the substrate is positively cooled by a cooling unit.

Further, preferably the first predetermined temperature in the heating step (a) is lower than the second predetermined temperature in the heating step (c). Therefore, when the heating step (a). and the heating step (c) are performed in the same treating unit, preferably a space between the substrate and a heating plate in the heating step (a) is larger than that in the heating step (c).

According to the second aspect of the present invention, a substrate treating method for performing predetermined treatment for substrates coated with a coating solution including the steps of (a) heating the substrates coated with the coating solution one by one at a first predetermined temperature, (b) lowering the temperature of the substrates by positively cooling the substrates and/or by naturally releasing the heat thereof one by one after the step (a), (c) heating the substrates one by one at a second predetermined temperature after the step (b), (d) lowering the temperature of the substrates by positively cooling the substrates and/or by naturally releasing the heat thereof one by one after the step (c), and (e) heating the substrates one by one or plural substrates at a time at a third predetermined temperature after the step (d), is provided.

In the non-heated step (b) and the non-heated step (d) in the substrate treating method according to the second aspect, it is possible that the substrate is carried out of the heating unit, that is, the temperature of the substrate is lowered by natural heat release and/or that the substrate is positively cooled by the cooling unit.

Further, preferably the first predetermined temperature in the heating step (a) is lower than the second predetermined temperature in the heating step (c), and preferably the second predetermined temperature in the heating step (c) is lower than the third predetermined temperature in the heating step (e).

Furthermore, in the heating step (e), similarly to the heating steps (a) and (c), the substrates may be heat-treated one by one, or the plural substrates may be concurrently heat-treated in one treating unit, for example, a heating furnace or the like in order to enhance throughput of treatment.

According to the substrate treating method in accordance with the first and the second aspects, the heating step (a) can be performed before exposing the substrate, and the heating step (c) can be performed after exposing the substrate.

Moreover, predetermined treatment for the substrate, for example, drying treatment while supplying gas, drying treatment under reduced pressure, gelling treatment of a coating film, exchanging treatment of a coating film solvent after coating the solvent, removing treatment for removing at least a part of a coating film, or the like may be performed before the heating step (a) or between the heating step (a) and the heating step (c).

According to the third aspect of the present invention, a substrate treating method for performing predetermined treatment for a substrate coated with a coating solution including the steps of (a) heating the substrate coated with the coating solution, and (b) putting the substrate in a non-heated state after said step (a), with the steps (a) and (b) being repeated a plurality of times, is provided.

In the non-heated step (b) in the substrate treating method according to the third aspect, it is possible that the substrate is carried out of the heating unit, that is, the temperature of the substrate is lowered by natural heat release and/or that the substrate is positively cooled by the cooling unit.

With the repetition of the heating process and the non-heated process a plurality of times, it is preferable that the treating temperature in the heating process is set at higher temperature.

Further, predetermined treatment for the substrate, for example, drying treatment while supplying gas, drying treatment under reduced pressure, gelling treatment of a coating film, exchanging treatment of a coating film solvent after coating the solvent, removing treatment for removing at least a part of a coating film, or the like may be performed before the heating step (a) or between the heating step (a) and the non-heated step (b).

According to the first and the second aspects of the present invention, the substrate coated with the coating solution is heated at the first predetermined temperature, and after the above heating, through the non-heated step (b), the substrate is heated at the second predetermined temperature. According to the third aspect, the step of heating the substrate coated with the coating solution and the step of putting the substrate in a non-heated state are repeated a plurality of times, thus gradually releasing a solvent in the coating solution, promoting drying of the coating solution without exerting a bad influence on the coating film, and effectively preventing the occurrence of transfer on the substrate.

Further, in the first and the second aspects, a heating temperature in the heating step (a) is made lower than that in the heating step (c), thus holding down abrupt vaporization of the solvent in the coating solution to provide a more appropriate dried state and more effectively preventing the occurrence of transfer. The above difference in temperature can be realized by providing a low-temperature heating unit and a high-temperature heating unit both of which are different in set temperature, and by setting a space between the substrate and a heating plate in the heating step (a) larger than that in the heating step (c).

DETAILED DESCRIPTION OF THE INVENTION

Preferred embodiments of the present invention will be described below based on examples of a substrate treating method applied to a substrate treating apparatus used for a resist treating system for forming a coating film such as a photo resist on a surface of a glass substrate G for a liquid-crystal display (LCD) (referred to as "a substrate G" hereinafter. Incidentally, it goes without saying that the present invention is not limited to a glass substrate but applicable to a plate-shaped substrate such as a semiconductor wafer.)

Next, an embodiment of the present invention will be described in detail with reference to the attached drawings.

Figure 1:
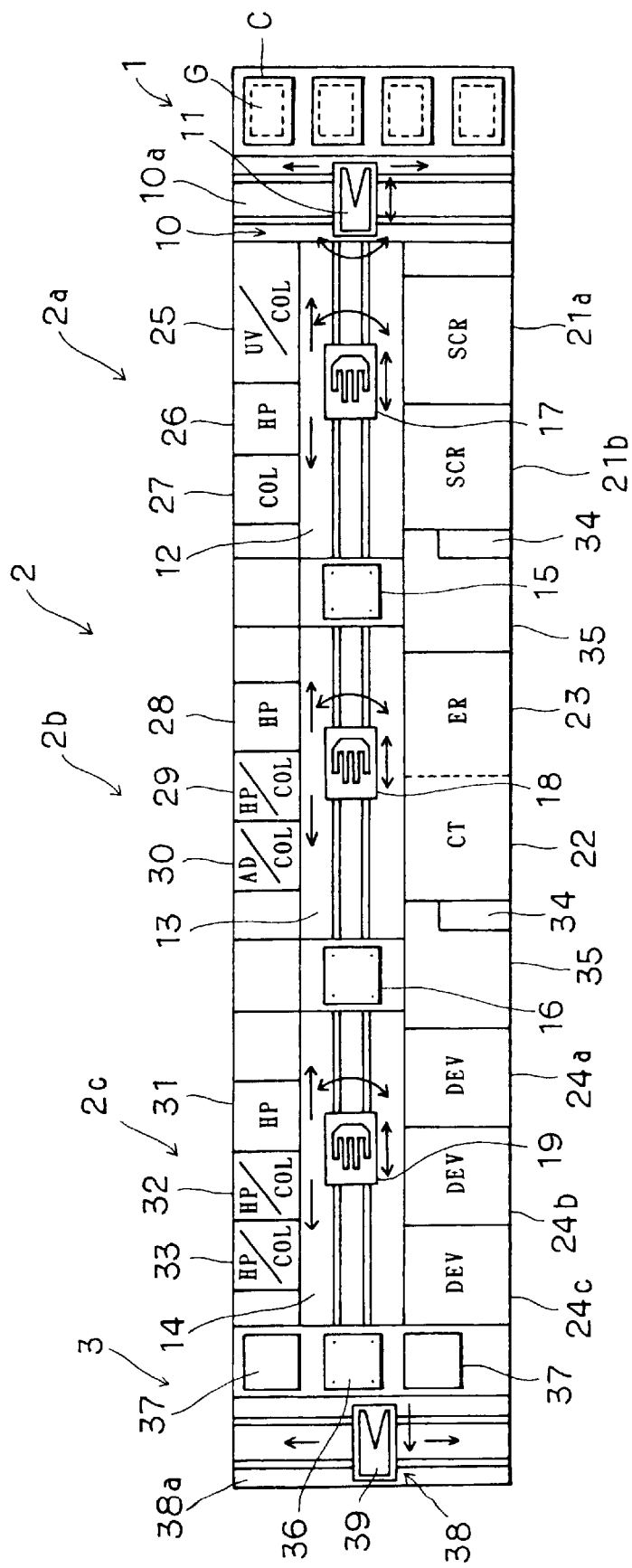
FIG. 1 is a plane view showing a coating and developing system of an LCD substrate to which the present invention is applied.

FIG. 1 is a plane view showing a coating and developing system of an LCD substrate as an example of a substrate treating apparatus to which the present invention is applied.

The coating and developing system includes a cassette station 1 for mounting a cassette C for housing a plurality of substrates G, a treatment section 2 provided with a plurality of treating units for performing a series of treatment including resist coating and developing for the substrate G, and an interface section 3 for sending and receiving the substrate G to/from an aligner (not shown), the cassette station 1 and the interface section 3 being arranged respectively at either end of the treatment section 2.

The cassette station 1 includes a carrier section 10 for carrying the substrate G between the cassette C and the treatment section 2. In the cassette station 1, the substrate G is carried in/out of the cassette C. The carrier section 10 includes a carrier mechanism 11 which is movable on a carrier path 10a provided along the direction of disposition of the cassettes C, and the substrate G is carried between the cassettes C and the treatment section 2 by means of the carrier mechanism 11.

The treatment section 2 is divided into a front section 2a, a middle section 2b, and a rear section 2c, respectively having carrier paths 12, 13, and 14 in the center thereof. Treating units are disposed at both sides of each of the carrier paths. Relay sections 15 and 16 are provided respectively between the front section 2a and the middle section 2b, and between the middle section 2b and the rear section 2c.

The front section 2a includes a main carrier device 17 movable along a carrier path 12. Two scrubbing units (SCR) 21a and 21b are disposed at one side of the carrier path 12, and an ultraviolet-light irradiating and cooling unit (UV/COL) 25, respectively vertically two-tiered heating units (HP) 26 and cooling units (COL) 27 are disposed at the other side of the carrier path 12.

The middle section 2b includes a main carrier device 18 movable along a carrier path 13. On one side of the carrier path 13, a resist coating unit (COT) 22 and an edge remover (ER) 23 for removing a resist at the peripheral portion of the substrate G are integrally provided, and on the other side thereof, two-tiered heating units (HP) 28, a heating and cooling unit (HP/COL) 29 composed of a heating unit and a cooling unit vertically tiered, and an adhesion treating and cooling unit (AD/COL) 30 in which an adhesion treating unit and a cooling unit are vertically tiered are arranged.

Further, the rear section 2c includes a main carrier device 19 movable along a carrier path 14. On one side of the carrier path 14, three developing units 24a, 24b, and 24c are disposed, and on the other side thereof, vertically two-tiered heating units 31, two heating and cooling units (HP/COL) 32 and 33 each composed of a heating unit and a cooling unit vertically tiered are disposed.

The treatment section 2 has a structure in which only spinner-system units such as the scrubbing unit 21a, the resist coating unit 22, and the developing unit 24a are arranged on one side of each carrier path and only heat-system treating units such as the heating unit and the cooling unit are arranged on the other side thereof.

A chemicals feed unit 34 is disposed at a portion on the side of the arrangement of spinner-system units of each of the relay sections 15 and 16, and moreover a space 35 sufficient to take the main carrier device in and out is provided thereat.

The main carrier device 17 has a function of sending and receiving the substrate G to/from an arm of the carrier mechanism 11, carrying the substrate G in/out of respective treating units in the front section 2a, and sending and receiving the substrate G to/from the relay section 15. The main carrier device 18 has a function of sending and receiving the substrate G to/from the relay section 15, carrying the substrate G in/out of respective treating units in the middle section 2b, and sending and receiving the substrate G to/from the relay section 16. The main carrier device 19 has a function of sending and receiving the substrate G to/from the relay section 16, carrying the substrate G in/out of respective treating units in the rear section 2c, and sending and receiving the substrate G to/from the interface section 3. Incidentally, the relay sections 15 and 16 function also as cooling plates.

The interface section 3 includes an extension 36 for temporarily holding the substrate when the substrate is sent and received to/from the treatment section 2, two buffer stages 37 for placing a buffer cassette on both sides of the extension 36, and a carrier mechanism 38 for carrying the substrate G in/out of the aligner (not shown). The carrier mechanism 38 has a carrier arm 39 movable on a carrier path 38a provided along the direction of disposition of the extension 36 and the buffer stages 37. The substrate G is carried between the treatment section 2 and the aligner by means of the carrier arm 39.

The respective treating units are put together to be integrated as above, thereby saving space and promoting efficiency of treatment.

In the coating and developing system structured as above, the substrate G in the cassette C is carried to the treatment section 2. In the treatment section 2, first in the front section 2a, the substrate G is given surface reforming and cleaning treatment and thereafter cooling treatment in the ultraviolet-light irradiating and cooling unit (UV/COL) 25, subsequently is scrubbed in the scrubbing units (SCR) 21a and 21b, dried by heating in one of the heating units (HP) 26, and then cooled in one of the cooling units (COL) 27.

Thereafter, the substrate G is carried to the middle section 2b. In order to improve the fixedness of a resist, the substrate G is given hydrophobic treatment (HMDS treatment) in the adhesion treating unit (AD) in the upper tier of the unit 30, cooled in the cooling unit (COL), and then coated with a resist in the resist coating unit (COT) 22. Subsequently, an excess resist on the periphery of the substrate G is removed in the edge remover (ER) 23. Then, the substrate G is pre-baked in one of the heating units (HP) in the middle section 2b and cooled in the cooling unit (COL) in the lower tier of the unit 29 or 30. In the present embodiment, the above pre-baking treatment is performed at predetermined timing a plurality of times as described later.

Later, the substrate G is carried from the relay section 16 to the aligner via the interface section 3 by means of the main carrier device 19 and a predetermined pattern is exposed in the aligner. The substrate G is brought in again via the interface section 3 and developed in any one of the developing units (DEV) 24a, 24b, and 24c to thereby form a predetermined circuit pattern. The developed substrate G is given post-baking treatment in any one of the heating units (HP) in the rear section 2c, cooled in the cooling unit (COL), and then housed in a predetermined cassette C on the cassette station 1 by means of the main carrier devices 19, 18, and 17 and the carrier mechanism 11.

Figure 2:
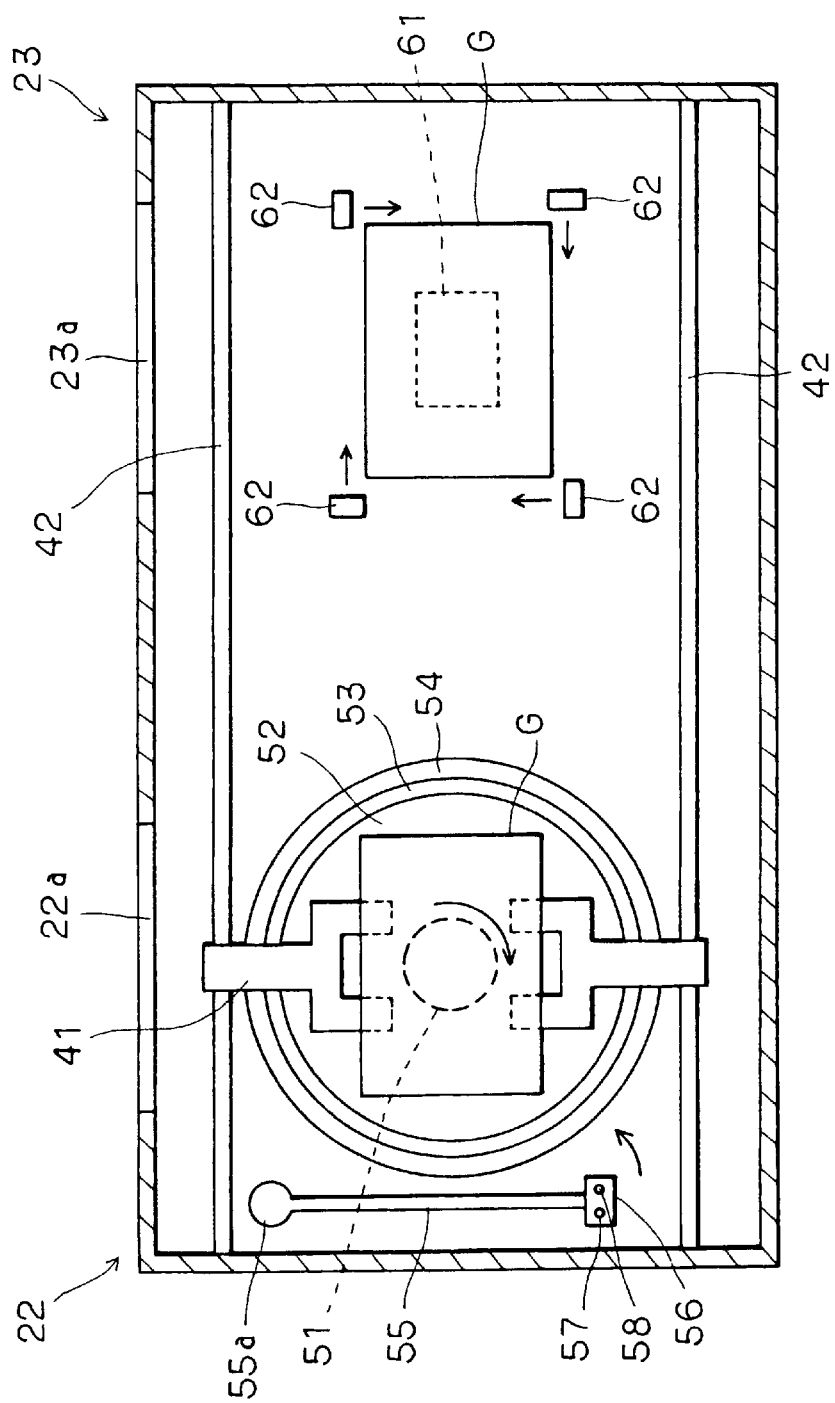
FIG. 2 is a schematic plane view showing the entire configurations of a resist coating unit (COT) and an edge remover (ER)

Next, the resist coating unit (COT) 22 and the edge remover (ER) 23 provided in the coating and developing system according to the present embodiment will be described. FIG. 2 is a schematic plane view showing the entire configurations of the resist coating unit (COT) and the edge remover (ER).

As shown in FIG. 2, the resist coating unit (COT) 22 and the edge remover (ER) 23 are integrally provided side by side on the same stage. The substrate G coated with the resist in the resist coating unit (COT) 22 is carried to the edge remover (ER) 23 by means of a pair of carrier arms 41 movable along guide rails 42. Incidentally, an opening 22a for carrying the substrate G in by the main carrier device 18 is formed in a face at the carrier path 13 side of the resist coating unit (COT) 22, and an opening 23a for carrying the substrate G out by the main carrier device 18 is formed in a face at the carrier path 13 side of the edge remover (ER) 23.

The resist coating unit (COT) 22 includes a horizontally rotatable spin chuck 51 for adsorbing and holding the substrate G, a bottomed cylindrical rotating cup 52 enclosing an upper end portion of the spin chuck 51 and surrounding the substrate G adsorbed and held by the spin chuck 51, the upper end portion of the rotating cup being opened, a lid body (not shown) being put on the upper end opening of the rotating cup 52, a coater cup 53 fixedly disposed in such a manner to enclose the outer periphery of the rotating cup 52 for preventing a resist from being scattered when the resist is coated, and a hollow ring-shaped drain cup 54 disposed to surround the coater cup 53. When a resist is dropped, as is described later, with the lid body being taken off from the rotating cup 52, the substrate G together with the spin chuck 51 is rotated at low speed by means of a rotating mechanism not shown and concurrently the rotating cup 52 is rotated. When the resist is spread, with the rotating cup 52 being covered with the lid body not shown, the substrate G together with the spin chuck 51 is rotated at high speed by means of the rotating mechanism not shown and concurrently the rotating cup 52 is rotated.

The resist coating unit (COT) 22 has an arm 55 provided with a jet head 56 for supplying a resist solution and a solvent to the substrate G at the front end thereof. The arm 55 can rotate on a shaft 55a. When a resist is coated, the jet head 56 is located above the substrate G adsorbed by the spin chuck 51, and when the substrate G is carried, the jet head 56 is placed at a stand-by position outside the drain cup 54 as shown in the drawing. The jet head 56 is provided with a resist nozzle 57 for discharging a resist solution and a solvent nozzle 58 for discharging a solvent such as a thinner. The resist nozzle 57 is connected to a resist feed element (not shown) through a resist feed pipe (not shown), and the solvent nozzle 58 is connected to a solvent feed element (not shown) through a solvent feed pipe (not shown).

The edge remover (ER) 23 is provided with a mounting table 61, on which the substrate G is mounted. Four remover heads 62 for removing an excess resist solution from the edges of four sides of the substrate G are provided on four sides of the substrate G respectively. Each remover head 62 has a nearly U-shaped cross-sectional face so as to discharge a thinner from the inside thereof and is moved along four sides of the substrate G by means of a moving mechanism (not shown). Thus, each remover head 62 can remove the excess resist adhering to the edges of four sides of the substrate G while moving along each side of the substrate G and discharging a thinner.

As to the resist coating unit (COT) 22 and the edge remover (ER) 23 which are integrally structured as above, first in the resist coating unit (COT) 22, the substrate G together with the spin chuck 51 and the rotating cup 52 is rotated, the arm 55 is rotated so that the jet head 56 is located above the center of the substrate G, and a thinner is supplied to the center of the surface of the substrate G from the solvent nozzle 58.

Subsequently, with the substrate G being rotated, a resist is dropped on the center of the substrate G from the resist nozzle 57 to spread over the substrate G. Then, the rotating cup 52 is covered with the lid body not shown, and the rotational frequency of the substrate G is increased to thereby adjust the thickness of a resist film.

The substrate G thus resist-coated is carried from the spin chuck 51 to the edge remover (ER) 23 and mounted on the mounting table 61 by the carrier arm 41. In the edge remover (ER) 23, the four remover heads 62 move along the respective sides of the substrate G, and the excess resist adhering to the edges of four sides of the substrate G is removed by the discharged thinner.

Figure 3:
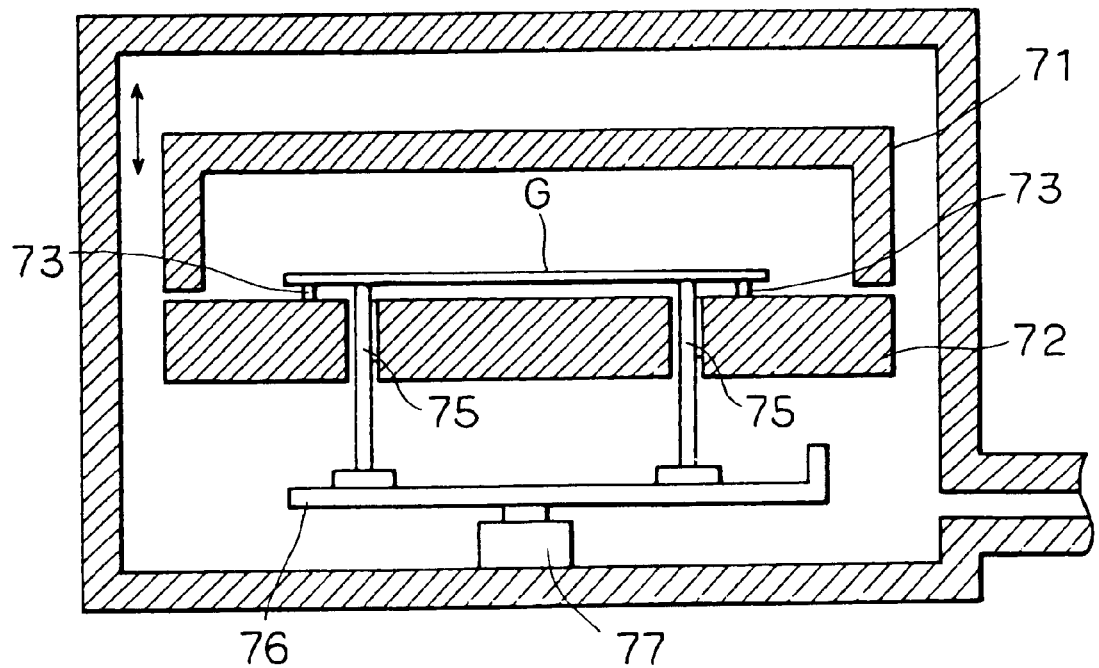
FIG. 3 is a schematic sectional view of a heating unit (HP)
Figure 4:
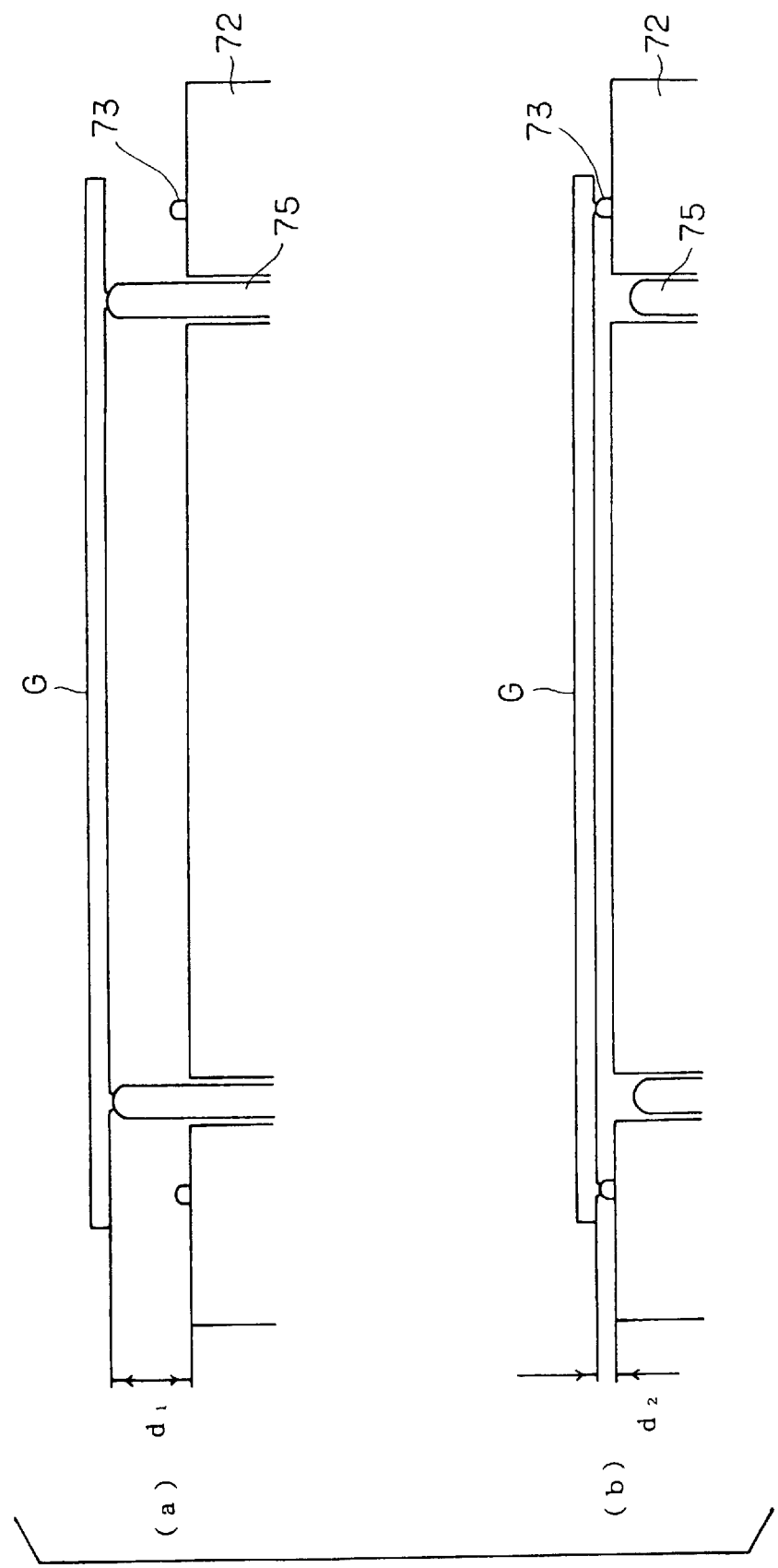
FIG. 4(a) and FIG. 4(b) are views showing the state that a substrate G is heated by the heating unit (HP) shown in FIG. 3.

Next, the heating unit (HP) will be described with reference to FIGS. 3, 4(a), and 4(b). FIG. 3 is a schematic sectional view of the heating unit (HP), and FIGS. 4(a) and 4(b) are views showing the state that the substrate G is heated by the heating unit (HP) shown in FIG. 3.

The heating unit (HP) (28, 29) has a cover 71 which can freely go up and down as shown in FIG. 3. A heating plate 72 for heating the substrate G is placed with the face thereof being horizontal under the cover 71. A heater (not shown) is attached to the heating plate 72, whereby the heating plate 72 can be set at a desired temperature.

Provided on the surface of the heating plate 72 are a plurality of securing pins 73, by which the substrate G is held. Namely, a proximity type is adopted, in which direct contact of the heating plate 72 and the substrate G is avoided and the substrate G is heated by heat radiated from the heating plate 72. Thus, contamination of the substrate G caused by the heating plate 72 is prevented.

A plurality of lifting pins 75 which go through a plurality of holes of the heating plate 72 are provided so as to freely go up and down. Lower portions of the lifting pins 75 are supported by a supporting member 76. The supporting member 76 is structured to be raised and lowered by a raising and lowering mechanism 77. Thus, when the supporting member 76 is raised by the raising and lowering mechanism 77, the lifting pins 75 are raised to receive the carried substrate G, subsequently lowered to place the substrate G on the securing pins 73 of the heating plate 72, and after heat treatment, raised again to lift the substrate G to a position for carrying the substrate G out.

In the present embodiment, the substrate G which is already coated with the resist solution and given end face treatment undergoes a first heating process and a second heating process with a non-heated process therebetween in the heating unit (HP) (28, 29).

In the first heating process, as shown in FIG. 4(a), the substrate G is supported by the lifting pins 75 and heated at a relatively lower temperature with a distance between the substrate G and the heating plate 72 of d1=3 mm to 5 mm, for example, the substrate and the heating plate being relatively apart from each other. Heating conditions under this situation are, for example, a heating temperature (a first predetermined temperature) of 60° C. to 70° C. and a heating time of about 60 seconds.

In the non-heated process after the above first heating process, the substrate G is taken out of the heating unit (HP), and thereafter the substrate G is left in a non-heated state and naturally cooled by natural heat release, or positively cooled by the cooling unit (COL) shown in FIG. 1. Specifically, the substrate G may be taken out of the heating unit (HP) (28, 29) and left as it is, being exposed to the air without positively being heated, or may be carried from the heating unit (HP) (28, 29) to the cooling unit (COL) and positively cooled at a predetermined temperature.

In the second heating process after the above non-heated process, as shown in FIG. 4(b), the substrate G is supported by the lifting pins 75 and heated at a relatively higher temperature with a distance between the substrate G and the heating plate 72 of d2=0.2 mm, the substrate and the heating plate being relatively close to each other. In this situation, the heating temperature (a second predetermined temperature) is 100° C. to 120° C. and the heating time is about 100 seconds.

As described above, the substrate G coated with the resist solution is heated at 60° C. to 70° C. (the first predetermined temperature). After the above heating, the substrate G naturally releases heat in a non-heated state or cooled, and after the natural heat release or the cooling, heated at 100° C. to 120° C. (the second predetermined temperature). Therefore, the relatively large-sized rectangular LCD substrate G is heated, naturally releases heat or is cooled, and heated, whereby a solvent such as a thinner in the resist solution is gradually released. According to the results of experiments, drying of the resist can be promoted without exerting a bad influence on the resist, and the occurrence of transfer on the substrate G can be effectively prevented.

It should be mentioned that the first and the second temperatures, heating times and the like are not limited to the above values. It is preferable, however, that the first heating temperature (the first predetermined temperature) is lower than the second heating temperature (the second predetermined temperature).

Further, in the present embodiment, heating processes and non-heated processes may be repeated a plurality of times, for example, a heating process→a non-heated process→a heating process→a non-heated process ... Also in this case, the relatively large-sized rectangular LCD substrate G is repeatedly heated and naturally cooled by natural heat release or positively cooled, whereby a solvent such as a thinner in the resist solution is gradually released. Thus, drying of the resist can be promoted without exerting a bad influence on the resist, and the occurrence of transfer on the substrate G can be effectively prevented.

Furthermore, from the viewpoint of preventing transfer after development, it is possible that the substrate G is cooled after the first heating process and that the second heating process is performed after exposure. Also in this case, drying of the resist can be promoted before development, and the occurrence of transfer after development can be effectively prevented.

Figure 5:
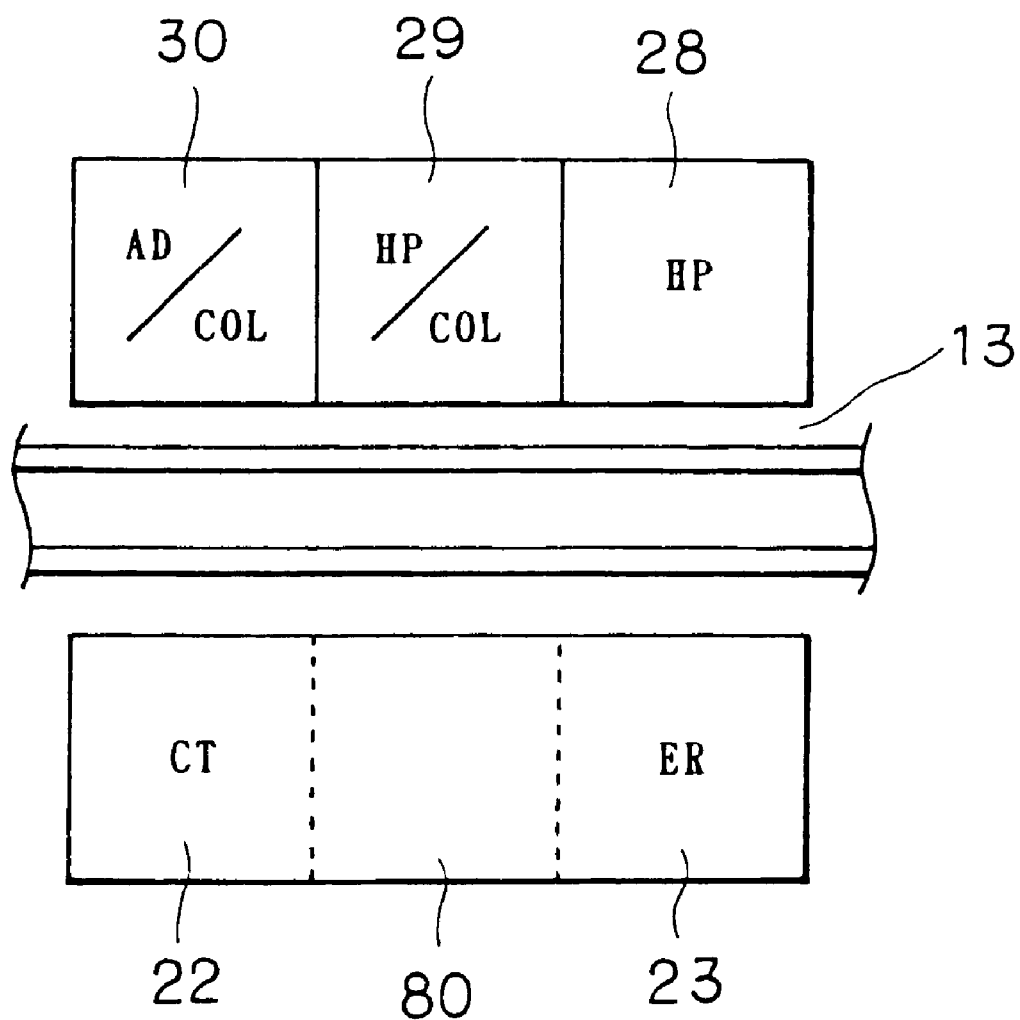
FIG. 5 is a plane view showing a part of a coating and developing system of an LCD substrate according to another embodiment.

Next, another embodiment of the present invention will be described with reference to FIGS. 5 and 6. FIG. 5 is a plane view showing a part of a coating and developing system of an LCD substrate according to another embodiment, and FIG. 6 is a schematic sectional view of a drying unit.

In this embodiment, as shown in FIG. 5, a drying unit 80 is disposed between the resist coating unit (COT) 22 and the edge remover (ER) 23. Thus, the substrate G coated with the resist solution is carried to the drying unit 80 to be dried and thereafter given end face treatment by the edge remover (ER) 23.

Figure 6:
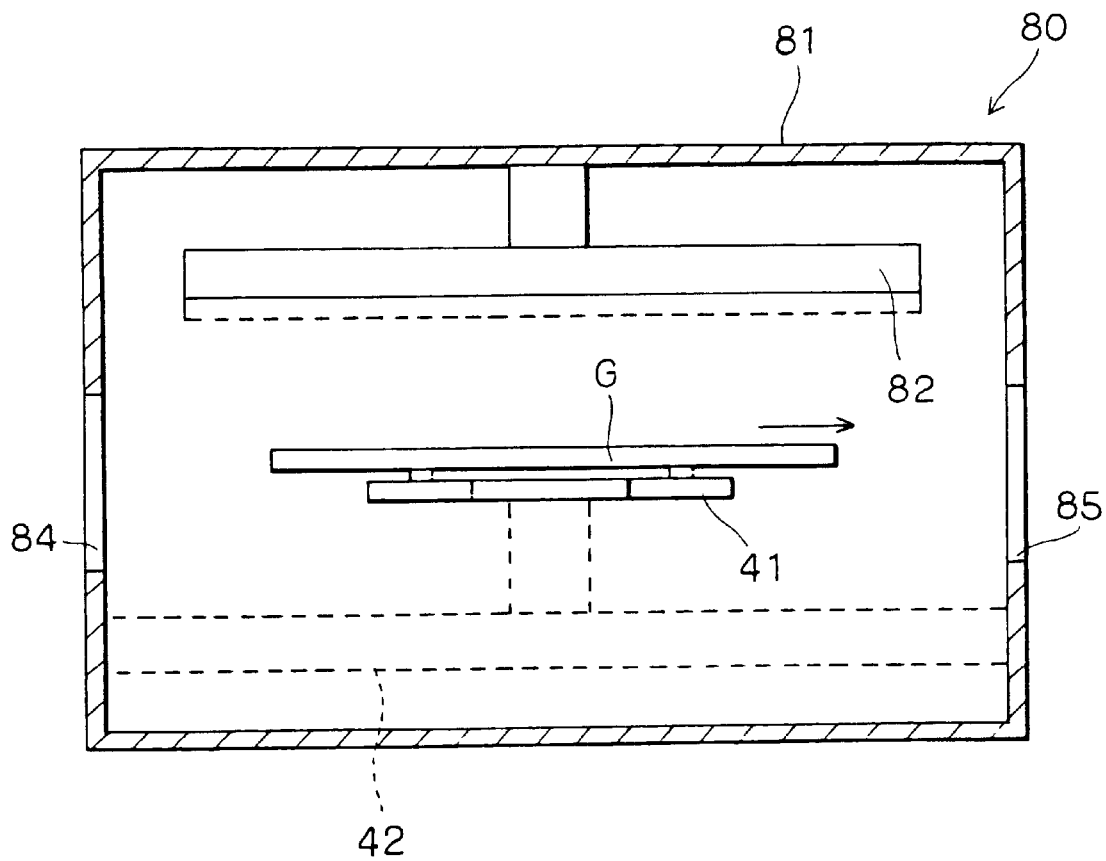
FIG. 6 is a schematic sectional view of a drying unit used in the system in FIG. 5.

As shown in FIG. 6, the drying unit 80 is provided with a shower head 82 for spouting gas such as inactive gas at the upper portion of a boxed-shaped body 81. Inactive gas and the like are spouted downward from the entire lower face of the shower head 82.

An opening 84 for carrying a substrate in and an opening 85 for carrying a substrate out are respectively provided in the front face and the rear face of the box-shaped body 81, and a portion cut off (not shown) for moving a carrier arm 41 is provided in a side wall thereof. The substrate G is sprayed with inactive gas and the like spouted from the shower head 82 while the substrate G which is brought in from the opening 84 by the carrier arm 41 moving along a guide rail 42 is moved in the box-shaped body 81 and then taken out of the opening 85.

By spraying inactive gas and the like on the substrate G while the substrate G is moved, drying of the resist solution coated on the substrate G is progressed and a solvent such as thinner in the resist solution is vaporized to a certain extent.

As described above, by drying the resist solution on the substrate G by spraying inactive gas and the like in a non-heated state just after coating of the resist solution and before heat treatment in the heating unit (HP), the solvent such as thinner in the resist solution is vaporized to a certain extent, thus promoting drying of the resist without exerting a bad influence on the resist, and effectively preventing the occurrence of transfer on the substrate G.

Since the solvent such as thinner in the resist solution is vaporized to a certain extent by spraying inactive gas and the like, the excess resist solution can be easily removed when the end face treatment of the substrate G is performed after the drying process.

Incidentally, the spraying of inactive gas and the like does not necessarily need to be performed while the substrate G is moving, but may be performed while the substrate G is at a standstill. As to the spouting of inactive gas and the like from the shower head 82, it is possible that inactive gas and the like are spouted from holes in a row instead of holes in the entire lower face.

Moreover, in place of drying by spraying inactive gas and the like shown in FIG. 6, drying under reduced pressure is available. Specifically, it is possible that a gas exhaust pipe (not shown) having an exhaust pump (not shown) is connected to the box-shaped body 81 and thus gas in a treatment chamber in the box-shaped body 81 is exhausted by the exhaust pump. Also in this case, by pressure being reduced, a solvent such as thinner in a resist solution is vaporized to a certain extent, thus effectively preventing transfer marks of the lifting pins 75 and the like from being left on the substrate G.

The coating and developing system of an LCD substrate according to another embodiment of the present invention is structured as above. Next, as still another embodiment of the present invention, an example in which the present invention is adopted to a coating film forming system (SOD system) for forming a layer insulating film on a semiconductor wafer will be described.

Figure 7:
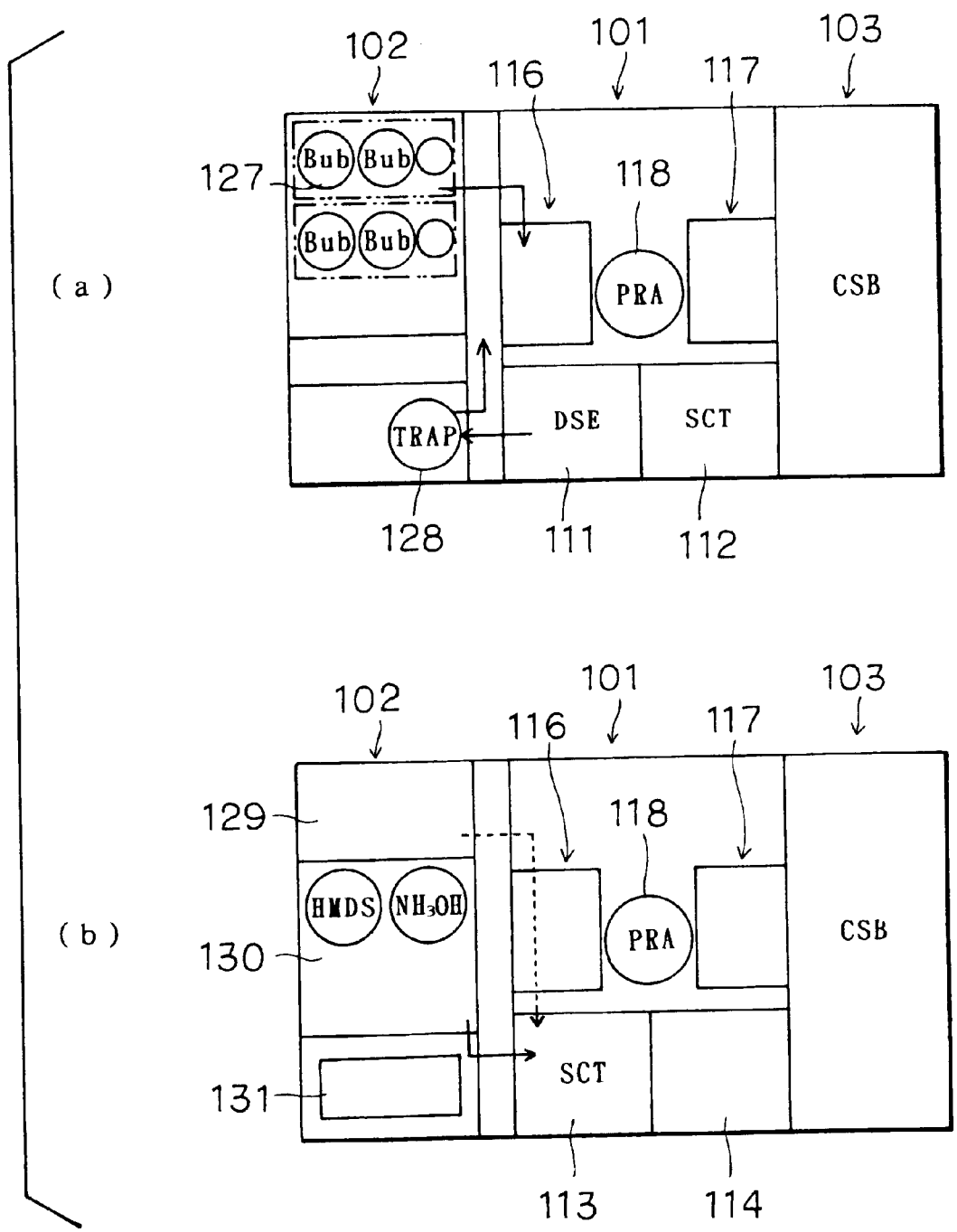
FIG. 7(a) and FIG. 7(b) are plane views respectively of the upper tier and the lower tier of a coating film forming system (SOD system) according to still another embodiment of the present invention.
Figure 8:
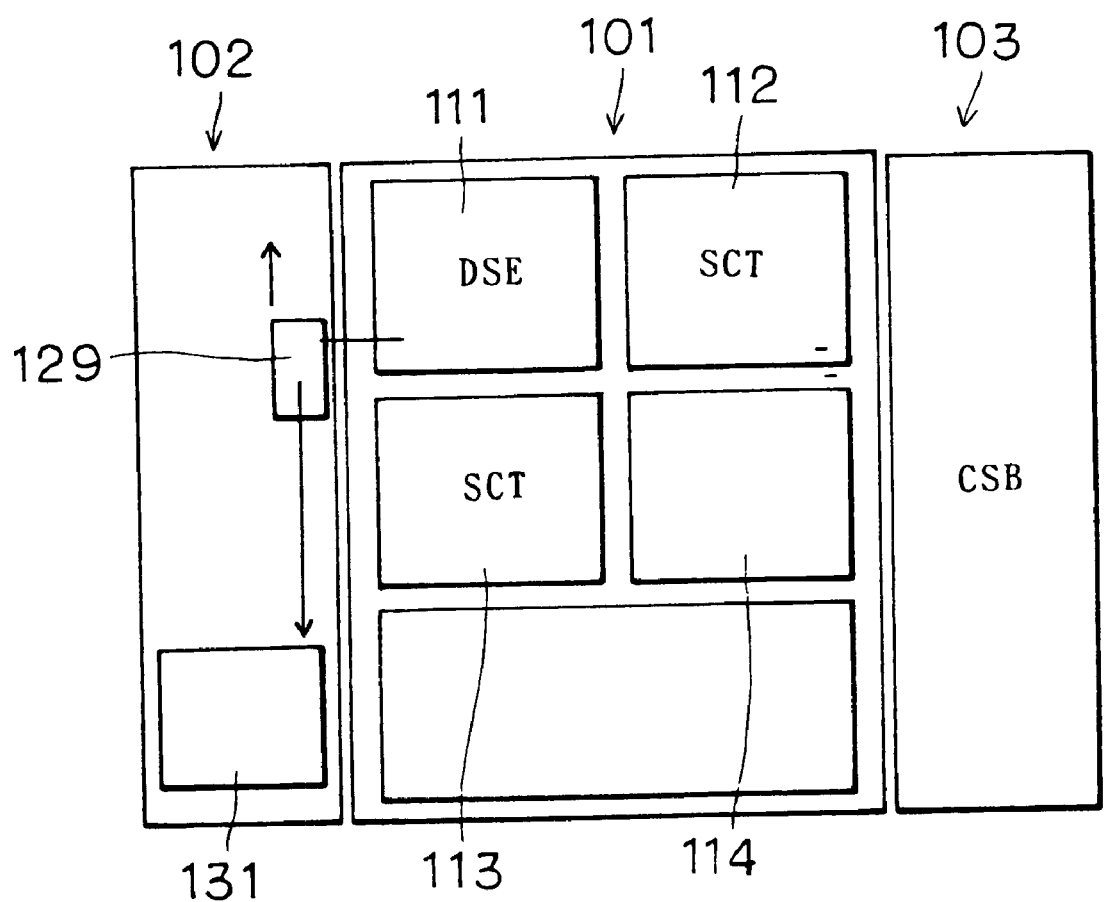
FIG. 8 is a side elevational view of the coating film forming system (SOD system) shown in FIG. 7.
Figure 9:
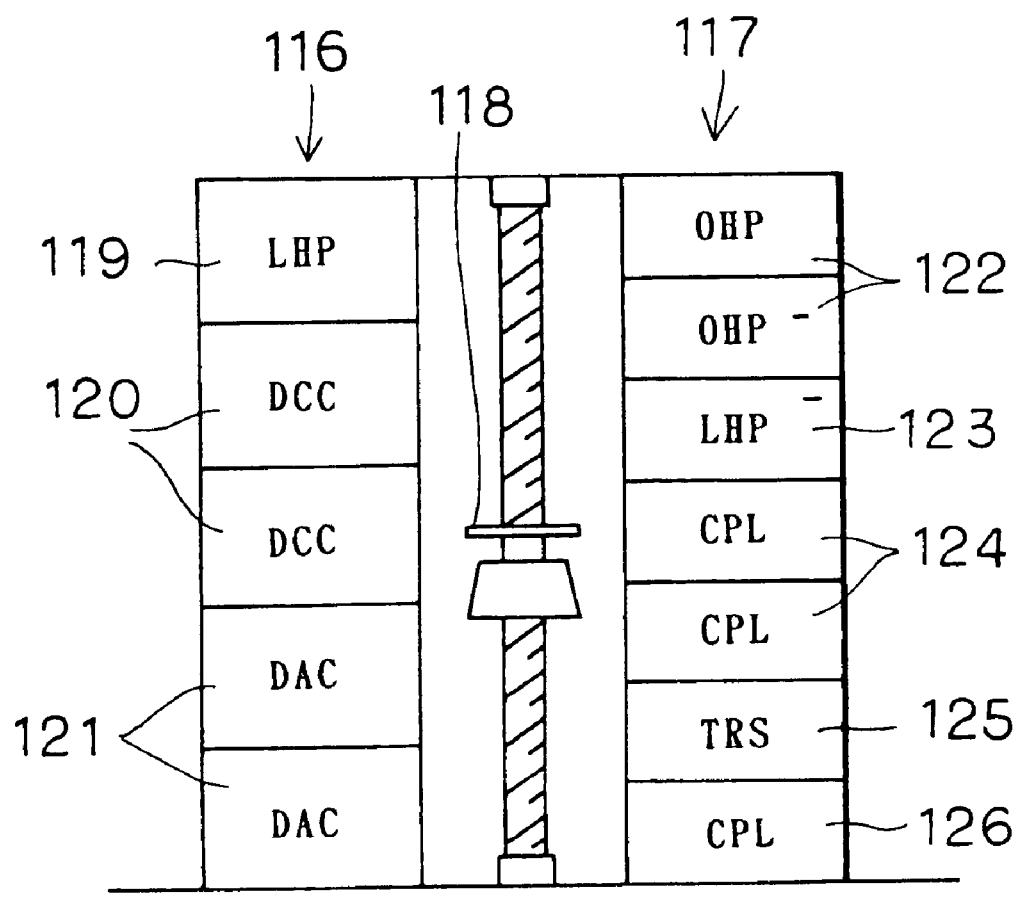
FIG. 9 is a side elevational view showing two treating unit groups, in each of which a plurality of treating units are multi-tiered, provided in the coating film forming system (SOD system) shown in FIG. 7.

FIG. 7(a) is a plane view of the upper tier of an SOD system according to still another embodiment of the present invention, FIG. 7(b) is a plane view of the lower tear of the SOD system, FIG. 8 is a side elevational view of the SOD system shown in FIG. 7, and FIG. 9 is a side elevational view of two units-tiered bodies provided in the SOD system shown in FIG. 7.

The SOD system schematically includes a treatment section 101, a side cabinet 102, and a carrier station (CSB) 103.

As shown in FIG. 7(a) and FIG. 8, the treatment section 101 includes a solvent exchange unit (DSE) 111, disposed in the upper tier at the front side, for coating a solvent on a substrate W to thereby exchange a solvent on the coating film, a high-viscosity coating unit (SCT) 112 for coating a high-viscosity coating solution on the substrate W, and in addition, as shown in FIG. 7(b) and FIG. 8, a low-viscosity coating unit (SCT) 113, disposed in the lower tier at the front side, for coating a high-viscosity coating solution on the substrate W and a chemical chamber 114 storing chemicals and the like.

As shown in FIGS. 7(a) and 7(b), treating unit groups 116 and 117 in each of which a plurality of treating units are vertically multi-tiered are provided in the central portion of the treatment section 101, and a carrier mechanism 118 which goes up and down to carry the substrate W is arranged therebetween. As shown in FIG. 9, the left treating unit group 116 is composed of a low-temperature hot plate (LHP) 119, two DCC treating units (Dielectric Oxygen Density Controlled Cure and Coolling-off) 120 for heating and cooling the substrate in low oxygen-density atmosphere to cure a coating film, and two aging units (DAC) 121 for gelatinizing the coating film, which are tiered in descending order. The right treating unit group 117 is composed of two high-temperature hot plates (OHP) 122, a low-temperature hot plate (LHP) 123, two cooling plates (CPL) 124, a transfer section (TRS) 125, and a cooling plate (CPL) 126, which are tiered in descending order. Incidentally, the transfer section (TRS) 125 is structured to function also as a cooling plate.

The side cabinet 102 includes a bubbler 127 for feeding chemicals and a trap (TRAP) 128 for cleaning exhaust gas in the upper tier thereof, and includes a power supply source 129, a chemical chamber 130 for storing chemicals such as HMDS and ammonia, and a drain 131 for exhausting drainage in the lower tier thereof.

Next, a case where a layer insulating film is formed by a sol-gel process in the SOD system structured as above will be described in detail.

In the sol-gel process, a coating film is usually formed in the sequence of the cooling plates (CPL) 124 and 126→the low-viscosity coating unit (SCT) 113→the aging unit (DAC) 12→the solvent exchange unit (DSE) 111→the low-temperature hot plates (LHP) 119 and 123→the high-temperature holt plate (OHP) 122. Accordingly, when a layer insulating film is formed by the sol-gel process, the treatment section 101 is composed of the low-viscosity coating unit (SCT) 113, the aging unit (DAC) 121, the solvent exchange unit (DSE) 111 and the like as the principal section thereof.

Figure 10:
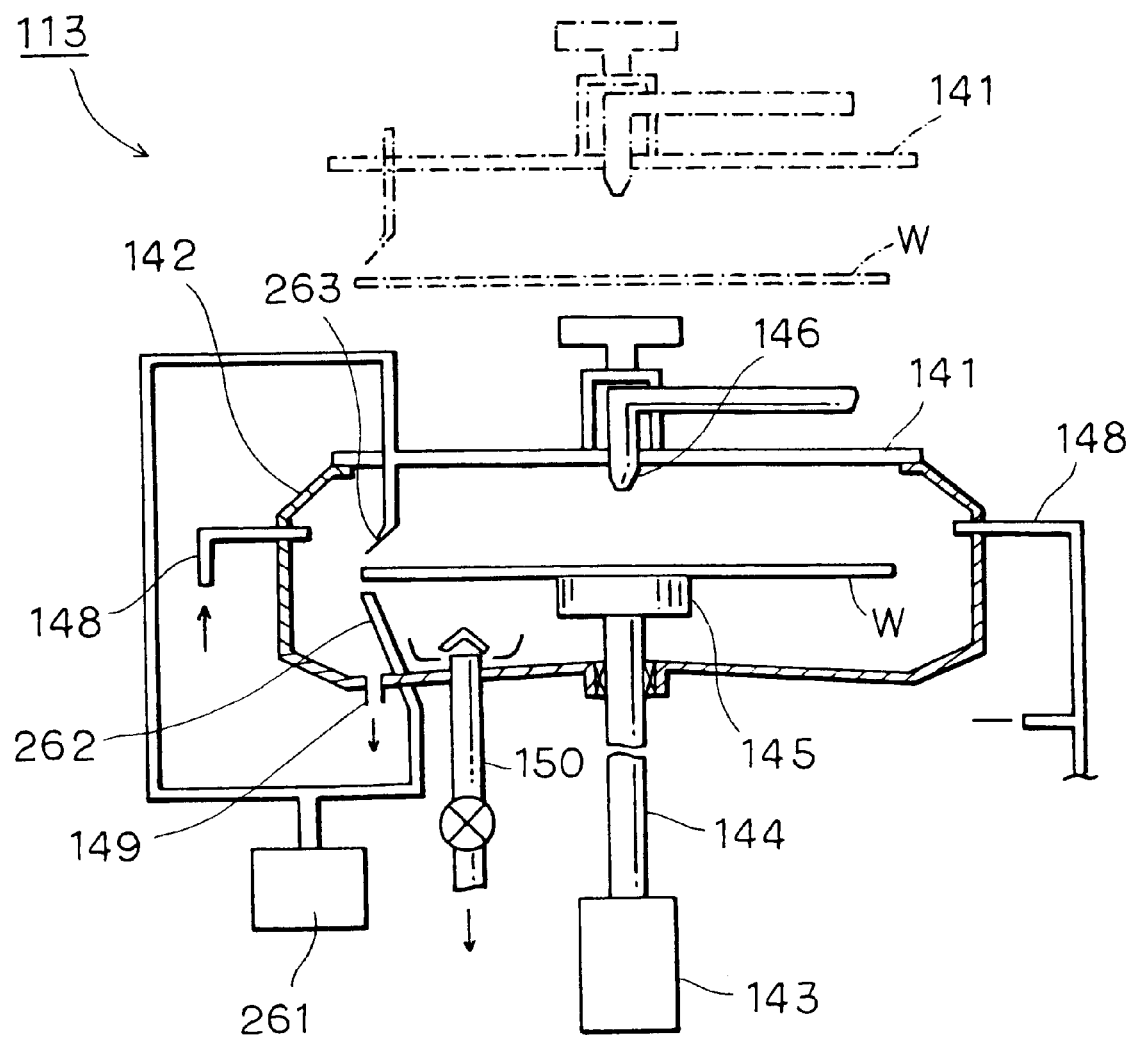
FIG. 10 is a sectional view schematically showing a low-viscosity coating unit (SCT)

As shown in FIG. 10, the low-viscosity coating unit (SCT) 113 includes a fixed cup 142 with the upper portion thereof being opened and closed with a lid 141, a rotating shaft 144 which is inserted from the bottom face of the fixed cup 142, raised and lowered, and rotated by a drive element 143, a vacuum chuck 145 which is a substrate holding element provided at the upper end of the rotating shaft 144, and a coating solution nozzle 146 combined with the lid 141 for supplying a coating solution to the central portion of the substrate W. Solvent nozzles 262, and 263 for supplying a solvent which is a cleaning agent for removing a coating film at the peripheral portion of the substrate W (edge rinse treatment) from a solvent supply source 261 are provided at the bottom face of the fixed cup 142 and at the lid 141 respectively. The main purpose of the solvent nozzle 263 provided at the lid 141 is to discharge a solvent toward the periphery of the front face side of the substrate W. The main purpose of the solvent nozzle 262 provided at the fixed cup 142 is to discharge a solvent toward the periphery of the rear face side of the substrate W to remove a coating solution reaching the rear side of the substrate W. A drain pipe 149 and an exhaust pipe 150 as well as a solvent vapor feed pipe 148 for supplying vapor of a solvent used in a coating solution, for example, ethylene glycol are connected to the fixed cup 142. A coating solution and a solvent used in this unit is supplied from the chemical chamber 114. In the chemical chamber 114, chemicals other than chemicals such as ammonia and HMDS exerting a bad influence on treatment are stored. Incidentally, the high-viscosity coating unit (SCT) 112 is structured almost similarly to the low-viscosity coating unit (SCT) 113.

Figure 11:
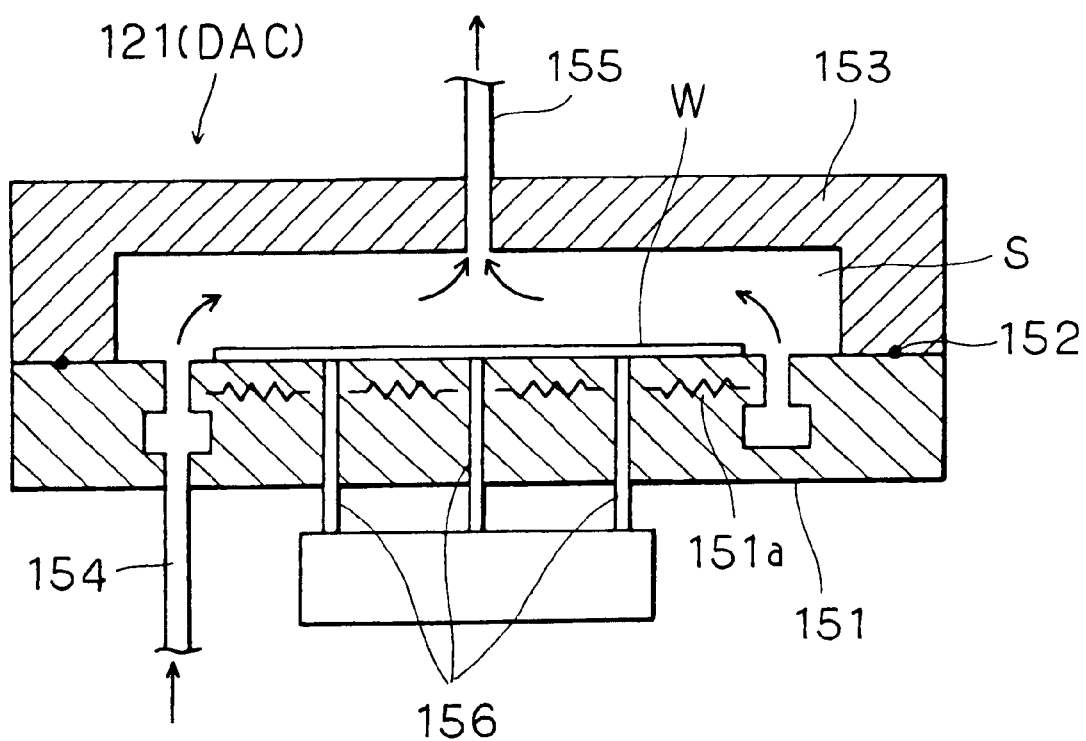
FIG. 11 is a sectional view schematically showing an aging unit (DAC)

As shown in FIG. 11, the aging unit (DAC) 121 includes a heating plate 151 made of ceramics, for example, with a built-in heater 151a, a lid 153 which is closely attached to the peripheral portion of the heating plate 151 via a sealing member 152 in such a manner to form a space S composing a treatment chamber above the heating plate 151 and which is detached from the heating plate 151, a gas feed passage 154 feed ports of which are formed in the surface of the heating plate 151 in such a manner to enclose the substrate W placed on the heating plate 151, an exhaust passage 155 an inlet port of which is formed at a central portion of the lid 153, and three raising and lowering pins 156 for raising and lowering the substrate G between the heating plate 151 and a position above the heating plate 151.

As described later, in the aging unit (DAC) 121, ammonia is vaporized by means of the bubbler 127 and a mass flow controller (not shown) in the side cabinet 102 and supplied to the treatment chamber S through the aforementioned gas feed passage 154, and exhaust gas from the exhaust passage 155 is trapped by the drain tank 131 in the side cabinet 102.

Figure 12:
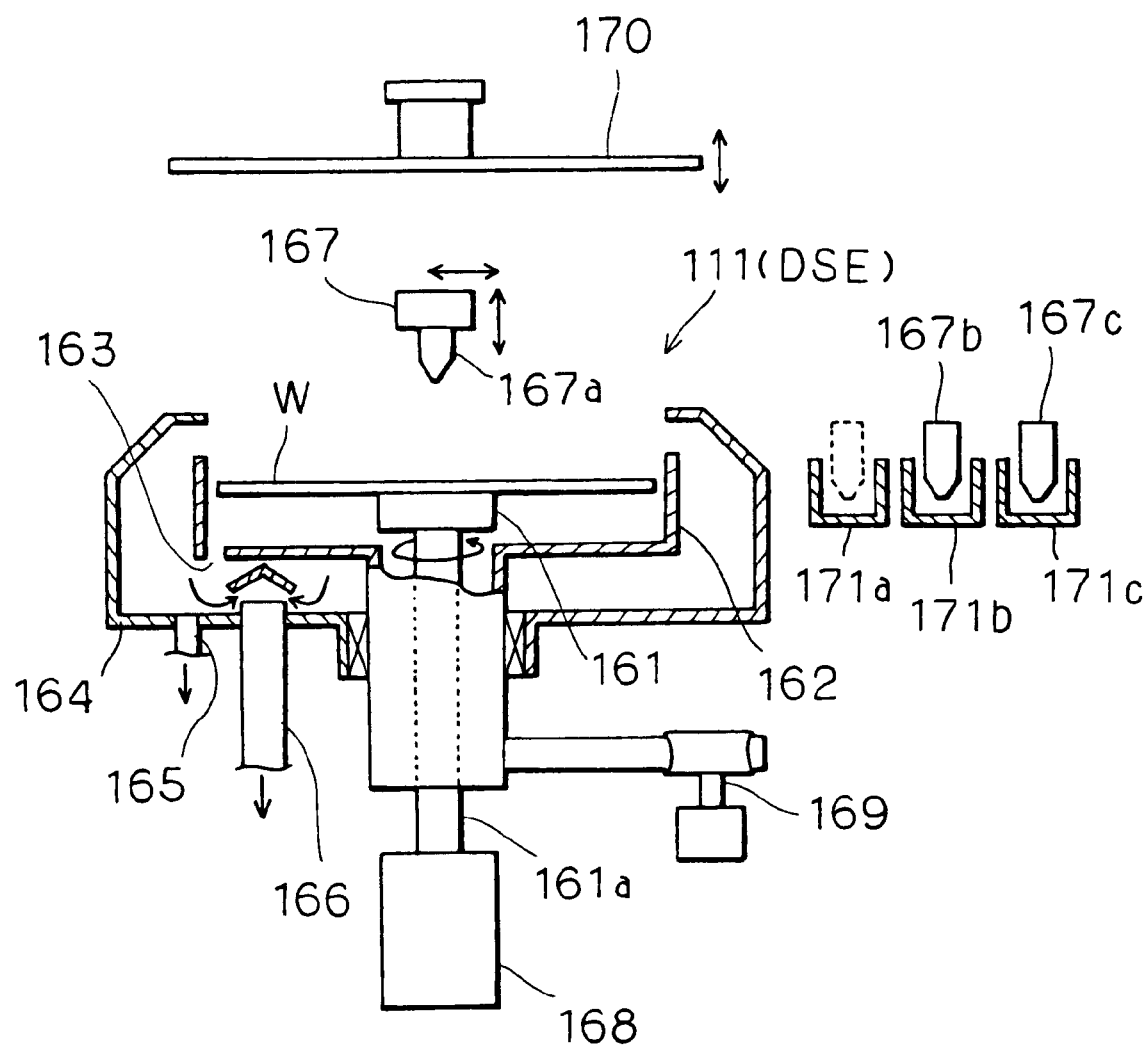
FIG. 12 is a sectional view schematically showing a solvent exchange unit (DSE)

As shown in FIG. 12, the solvent exchange unit (DSE) 111 includes a vacuum chuck 161 for rotating the substrate W while horizontally holding it, a rotating cup 162 disposed to surround the substrate W on the chuck 161 and having a drain port 163, a fixed cup 164, disposed outside the rotating cup 162, to which a drain passage 165 and an exhaust passage 166 are connected, and a nozzle 167 for supplying a solvent to the substrate W. The reference numeral 168 in FIG. 12 is a drive element for rotating, raising and lowering a rotating shaft 161a of the chuck 161, and the reference numeral 169 is a drive element for rotating the rotating cup 162.

An opening at the upper portion of the aforesaid fixed cup 162 is opened and closed with a lid 170 which can ascend and descend. The nozzle 167 has three replacement nozzles 167a, 167b, and 167c for discharging ethanol, HMDS, and heptane, respectively. The replacement nozzles 167a, 167b, and 167c are gripped and taken out of nozzle receiving elements 171a, 171b, and 171c respectively, and carried to a position above the center of the substrate W. When HMDS is supplied to the replacement nozzle 167b of the nozzle 167, the HMDS is directly supplied from an HMDS tank 130a of the side cabinet 102. Exhaust gas mixed with liquid from the exhaust passage 166 is separated into gas and liquid by a mist trap 128 in the cabinet 102, and drainage from the drain passage 165 is exhausted to the drain tank 131.

The side cabinet 102 is provided at a position adjacent to the treatment section 101, but isolated from the treatment section 101, and has the bubbler 127 for feeding chemicals and the mist trap (TRAP) 128 for separating gas-liquid mixture into gas and liquid and exhausting exhaust gas in the upper tier thereof and the power supply source 129, the chemical chamber 130 for storing chemicals such as HMDS and ammonia, and the drain 131 for exhausting drainage in the lower tier thereof.

Since the side cabinet 102 is structured as above, when ammonia is supplied to the aging unit (DAC) 121, the ammonia is filled into the bubbler 127 from an ammonia tank 130b, and the ammonia is bubbled by the bubbler 127 and vaporized to be supplied to the aging unit (DAC) 121. When HMDS is supplied to the solvent exchange unit (DSE) 111, the HMDS is directly supplied from the HMDS tank 130a.

Exhaust gas from the aging unit (DAC) 121 is trapped by the drain tank 131 in the side cabinet 102. In addition, exhaust gas mixed with liquid from the solvent exchange unit (DSE) 111 is separated into gas and liquid by the mist trap 128 in the cabinet 102, and drainage is exhausted to the drain tank 131.

As described above, the aging unit (DAC) 121 and the solvent exchange unit (DSE) 111, each requiring ammonia and HMDS supplied from the side cabinet 102, are disposed adjacent to the side cabinet 102, thus shortening a chemicals feed system.

After a coating solution is coated on the substrate W, it is preferable that the coating solution is immediately gelatinized (for example, within 10 seconds). Therefore, as shown in FIGS. 7 to 9, the low-viscosity coating unit (SCT) 113 and the aging unit (DAC) 121 are arranged relatively close to each other. In addition, after the gel treatment, preferably exchange of solvents is immediately performed. Hence, the aging unit (DAC) 121 and the solvent exchange unit (DSE) 111 are arranged relatively close to each other.

Next, treating operation in the case of forming a layer insulating film by the sol-gel process in the aforesaid SOD system will be described.

First, the substrate W carried from the carrier station (CSB) 103 to the transfer section (TRS) 125 is carried to the cooling plates (CPL) 124 and 126 to be cooled by means of the carrier mechanism 118. Thus, temperatures of substrates before coating can be made constant, thereby improving uniformity of film thickness and film quality.

Subsequently, the substrate W is carried to the low-viscosity coating unit (SCT) 113 and delivered to the chuck 145 as shown in FIG. 10, and the rotating cup 142 is tightly closed by the lid 141. The coating solution to be used here is that colloids or particles of TEOS are dispersed in an organic solvent and water and a small amount of hydrochloric acid are contained therein. While gas is exhausted from the exhaust pipe 150, vapor of the organic solvent is supplied into the rotating cup 142 from the solvent vapor feed pipe 148, and after the rotating cup 142 is filled with vapor of the organic solvent, exhaust is stopped, and the coating solution is dropped on the central portion of the substrate W from the nozzle 146. Subsequently, the substrate W is rotated by the chuck 145, and the coating solution spreads over the surface of the substrate W, thereby forming a coating film. In addition, a solvent is supplied to the peripheral portion of the substrate W from the nozzles 262 and 263 to remove the peripheral portion of the coating film on the substrate W. Due to the aforesaid removal of the coating film on the peripheral portion of the substrate W, the carrier mechanism 118 and the coating solution do not touch with each other when the coated substrate W is carried. Consequently, it is prevented that the carrier mechanism 118 is smudged with the coating solution and that the adherent coating solution is dried to become particles, which results in contamination of the inside of the unit. The reason why the coating treatment is performed with the rotating cup 142 filled with the vapor of the organic solvent is that vaporization of the solvent in the coating solution is prevented.

The substrate W on which the coating film is thus formed is carried to the aging unit (DAC) 121. As shown in FIG. 11, in the aging unit (DAC) 121, the lid 153 is raised, and the substrate W is delivered to the raising and lowering pins 156 and brought close to the heating plate 151. After the lid 153 is shut down, while gas is exhausted from the exhaust passage 155, ammonia is supplied into the treatment chamber S from the bubbler 127 in the cabinet 102 through the gas feed passage 154. At this time, the substrate W is heated at a temperature of 100° C., for example. Consequently, colloids contained in the coating film on the substrate W are gelatinized and linked in the form of a mesh of a net.

Thereafter, the substrate W is carried to the solvent exchange unit (DSE) 111. As shown in FIG. 12, in the solvent exchange unit (DSE) 111, the substrate W is delivered to the vacuum chuck 161, a moisture-soluble chemical, for example, ethanol is dropped on the central portion of the substrate W from the replacement nozzle 167a of the nozzle 167, and the substrate W and the rotating cup 162 are rotated to spread the ethanol over the entire surface of the substrate W. Thus, the ethanol is dissolved into moisture in the coating film, and as a result, the moisture is exchanged for the ethanol.

Subsequently, the lid 170 is taken off, and HMDS is dropped on the central portion of the substrate W in the same way as above, whereby hydroxide salt in the coating film is removed. Moreover, heptane is dropped on the substrate W, and a solvent in the coating film is exchanged for the heptane. The reason for using heptane is that the use of a solvent with small surface tension allows force applied to a porous structural body, that is, a net-shaped structural body of TEOS to reduce, thus preventing the structural body from being broken.

As described above, as a preliminary process before heat treatment, treatment is performed for the substrate W, on which a coating film is already formed, in the aging unit (DAC) 121 and the solvent exchange unit (DSE) 111. As a result, the coating film on the substrate W can be gelatinized and the solvent in the coating film can be exchanged without the organic solvent in the coating film necessary for forming a layer insulating film being dried.

Although ammonia is used in the above aging unit (DAC) 121 and HMDS and heptane are used in the solvent exchange unit (DSE) 111, the present invention is not limited to them.

Thereafter, the substrate W is heat-treated at a relatively lower temperature in the low-temperature hot plates (LHP) 119 and 123 (a first heating process). Heating conditions under this situation are, for example, a heating temperature (a first predetermined temperature) of 60° C. to 90° C. and a heating time of about 60 seconds.

In a non-heated process after the first heating process, after being carried out of the low-temperature hot plate (LHP), the substrate W is left in a non-heated state and naturally cooled by natural heat release or positively cooled by the cooling plates (CPL) 124 and 126.

In a second heating process after the non-heated process, the substrate W is heat-treated at a relatively higher temperature in the high-temperature hot plate (OHP) 122 to thereby finish a layer insulating film. In this situation, the heating temperature (a second predetermined temperature) is 150° C. to 340° C. and the heating time is about 60 seconds. The substrate W on which the layer insulating film is thus formed is returned to the carrier station (CSB) 103 via the transfer section (TCP) 125.

As described above, the substrate W coated with the coating solution is heated at 60° C. to 90° C. (the first predetermined temperature). After the above heating, the substrate W naturally releases heat in a non-heated state or cooled, and after natural cooling by the natural heat release or positive cooling, heated at 150° C. to 340° C. (the second predetermined temperature). By raising stepwise temperature in heat treatment as described above, the organic solvent in the coating solution is more gradually released, as compared with abrupt heating. According to the results of experiments, drying of the coating solution can be promoted without exerting a bad influence on the coating solution, and the occurrence of transfer on the substrate W can be effectively prevented.

Further, if required, it is possible that after the above second heating process, the substrate W is left again in a non-heated state to be naturally cooled by natural heat release, or the substrate W is positively cooled by the cooling plates (CPL) 124 and 126, and then a coating film formed on the surface of the substrate W is cured in the DCC treating unit which is described later. In this situation, the heating temperature (a third predetermined temperature) is 400° C. to 450° C. and the heating time is about 30 seconds. It is possible to use a heating furnace (not shown) which can heat a plurality of substrates W at the same time instead of the DCC treating unit.

Incidentally, the first, the second, and the third predetermined temperatures, heating times and the like are not limited to the above values. It is preferable, however, that the first heating temperature (the first predetermined temperature) is lower than the second heating temperature (the second predetermined temperature), and that the second heating temperature (the second predetermined temperature) is lower than the third heating temperature (the third predetermined temperature).

Further, in this embodiment, heating processes and non-heated processes may be repeated a plurality of times, for example, a heating process→a non-heated process→a heating process→a non-heated process . . . Also in this case, the substrate W is repeatedly heated and naturally cooled by natural heat release or positively cooled, whereby the organic solvent in the coating solution is gradually released. Thus, drying of the coating solution can be promoted without exerting a bad influence on the coating solution, and the occurrence of transfer on the substrate can be effectively prevented.

In the above embodiment, before heat treatment, the coating film on the substrate W is gelatinized and the solvent in the coating film is exchanged. But, depending on the heating temperature in the first heating process, the coating film on the substrate W can be gelatinized and the solvent in the coating film can be exchanged between the first heating process and the second heating process.

Next, a case where a layer insulating film is formed by a silking method, a speed filming method, or a foxing method in the aforesaid SOD system will be described in detail.

In the silking method, the speed filming method, or the foxing method, a coating film is formed in the sequence of the cooling plates (CPL) 124 and 126→the first coating unit (SCT) 113 (coating of an adhesion promoter)→the low-temperature hot plates (LHP) 119 and 123→the cooling plates (CPL) 124 and 126→the second coating unit (SCT) 112 (coating of the chemicals)→the low-temperature hot plates (LHP) 119 and 123→the high-temperature hot plate (OHP) 122→the DCC treating unit (DCC) 120.

Incidentally, in the foxing method, a coating film may be formed in the sequence of the cooling plates (CPL) 124 and 126→the coating unit (SCT) 112→the low-temperature hot plates (LHP) 119 and 123→the high-temperature hot plate (OHP) 122→the DCC treating unit (DCC) 120 without the coating of an adhesion promoter in the first coating unit (SCT) 113.

Figure 13:
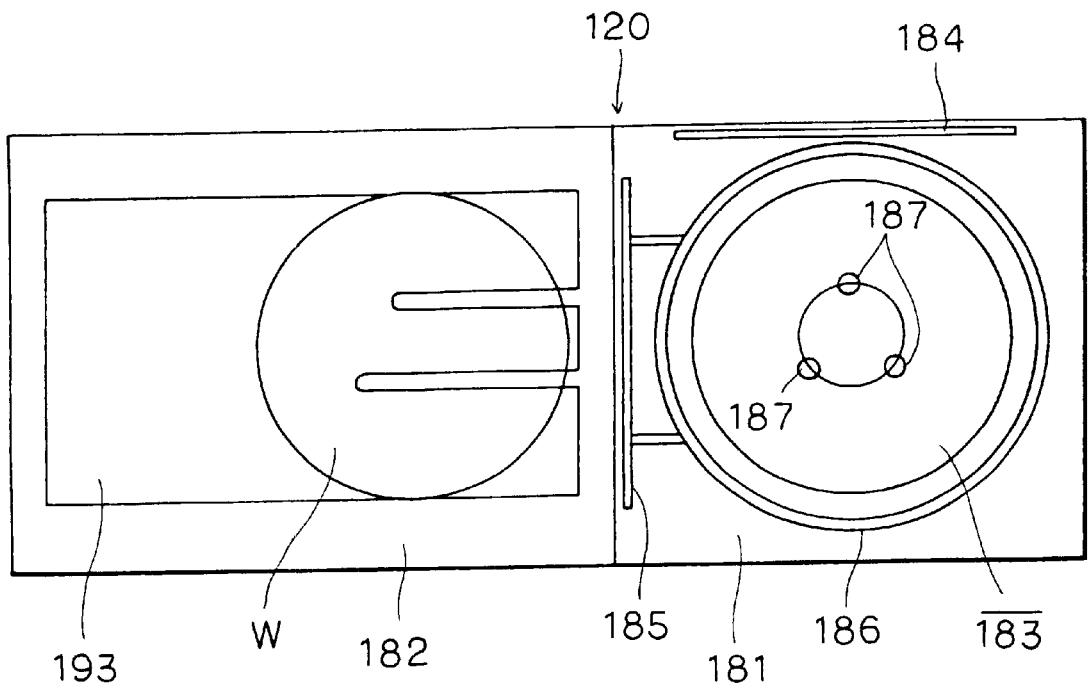
FIG. 13 is a plane view schematically showing a DCC treating unit.
Figure 14:
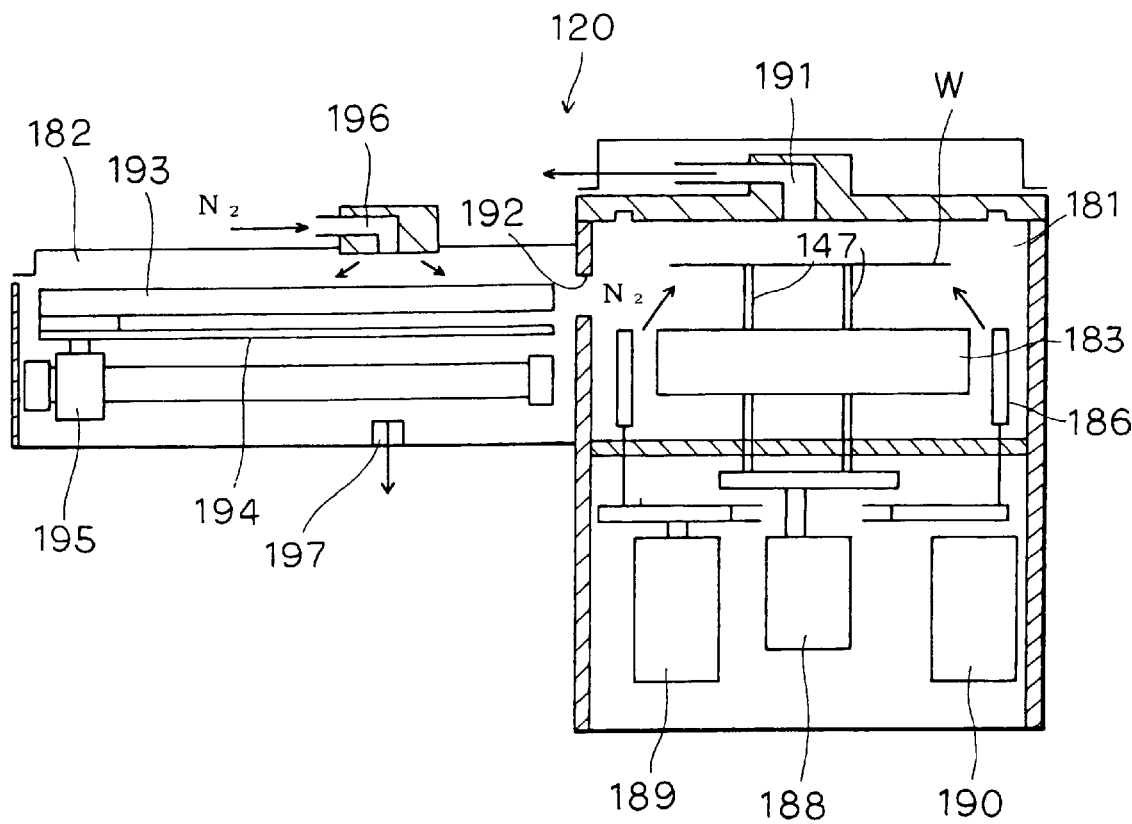
FIG. 14 is a sectional view schematically showing the DCC treating unit shown in FIG. 13.

In the above units, the DCC treating unit 120 includes a heating chamber 181 and a cooling chamber 182 provided adjacent thereto as shown in FIGS. 13 and 14. Provided in the heating chamber 181 is a hot plate 183 capable of setting temperature at 200° C. to 470° C. The DCC treating unit 120 further includes a first gate shutter 184 which is opened and closed when the substrate W is sent and received to/from the main carrier mechanism 118 (FIG. 7 and FIG.9), a second gate shutter 185 for opening and closing a space between the heating chamber 181 and the cooling chamber 182, and a ring shutter 186 raised and lowered together with the second gate shutter 185 while surrounding the substrate W around the hot plate 183. In the hot plate 183, three lifting pins 187 for mounting, and raising and lowering the substrate W are provided to be free to go up and down. Incidentally, a shielding screen may be provided between the hot plate 183 and the ring shutter 186.

Below the heating chamber 181, a raising and lowering mechanism 188 for raising and lowering the above three lifting pins 187, a raising and lowering mechanism 189 for raising and lowering the ring shutter 186 together with the second gate shutter 185, and a raising and lowering mechanism 190 for raising and lowering, and opening and closing the first gate shutter 184 are provided.

Further, inactive gas such as $N_2$ is fed into the heating chamber 181 from a supply source not shown, and the inside of the heating chamber 181 is exhausted through an exhaust pipe 191. Therefore, the inside of the heating chamber 181 is maintained in low oxygen-density atmosphere (for example, 50 ppm or less) by exhausting while supplying inactive gas.

The heating chamber 181 and the cooling chamber 182 communicate with each other through a communicating port 192, and a cooling plate 193 for placing and cooling the substrate W is structured to be horizontally movable along a guide rail 194 by means of a moving mechanism 195. Thus, the cooling plate 193 can enter the heating chamber 181 through the communicating port 192, receives the substrate W which is already heated by the hot plate 183 in the heating chamber 181 from the lifting pins 187, then carries the substrate W into the cooling chamber 182, and returns the substrate W on the lifting pins 187 after the substrate W is cooled.

Incidentally, the set temperature of the cooling plate 193 is 15° C. to 25° C., for example, and the applicable temperature range of the substrate W to be cooled is 200° C. to 470° C., for example.

The cooling chamber 182 is structured to be filled with inactive gas such as $N_2$ through a feed pipe 195 and exhausted to the outside through an exhaust pipe 197. Thus, the inside of the cooling chamber 182 is maintained in low oxygen-density atmosphere (for example, 50 ppm or less) similarly to the heating chamber 181.

Next, treating operation for forming a layer insulating film by the silking method, the speed filming method, and the foxing method will be described.

The substrate W carried from the carrier station (CSB) 103 to the transfer section (TRS) 125 is carried to the cooling plates (CPL) 124 and 126 to be cooled. As is the case with the sol-gel process, the temperature of the substrate W can be made constant by cooling before coating, thereby improving uniformity of film thickness and film quality.

Subsequently, the substrate W is carried to the low-viscosity coating unit (SCT) 113 and coated with an adhesion promoter as a first coating solution by means of the aforesaid spin coating. The adhesiveness of a film is promoted by coating the adhesion promoter prior to the coating solution. Thereafter, the substrate W is appropriately heat-treated by the low-temperature hot plates (LHP) 119 and 123 and carried to the cooling plates (CPL) 124, 126, where the temperature of the substrate W is controlled. Then, the substrate W is carried to the high-viscosity coating unit (SCT) 112 and coated with the coating solution for a layer insulating film as a second coating solution by means of the aforesaid spin coating.

Thereafter, the substrate W is heat-treated at a relatively lower temperature in the low-temperature hot plates (LHP) 119 and 123 (a first heating process). In this situation, the heating temperature (a first predetermined temperature) is 60° C. to 90° C. and the heating time is about 30 seconds. In a non-heated process after the first heating process, after being carried out of the low-temperature hot plate (LHP), the substrate W is left in a non-heated state and naturally cooled by natural heat release or positively cooled by the cooling plates (CPL) 124 and 126. In a second heating process after the non-heated process, the substrate W is heat-treated at a relatively higher temperature in the high-temperature hot plate (OHP) 122 (the second heating process). In this situation, the heating temperature (a second predetermined temperature) is 280° C. to 340° C. and the heating time is longer than the heating time in the first heating process, for example, about 90 seconds. Moreover, after the second heating process, a non-heated process similar to the above one is performed.

As described above, heating processes and non-heated processes are repeated for the substrate W. With the repetition of processes, the heating temperature is raised, thus gradually releasing the organic solvent in the coating solution, promoting drying of the coating solution without exerting a bad influence on the coating solution, and effectively preventing the occurrence of transfer on the substrate W as is the case for the aforesaid sol-gel process.

Further, in the silking method, the speed filming method, and the foxing method, curing treatment (a third heating process) is performed for the substrate W in the DCC treating unit 120. Specifically, the first gate shutter 184 is opened, and the substrate W is carried onto the three lifting pins 187 in the heating chamber 181 from the main carrier mechanism 118 (FIGS. 7 and 9). The first gate shutter 184 is closed, the ring shutter 186 and the second gate shutter 185 are raised, and the substrate W is surrounded by the ring shutter 186. At this time, the filling of inactive gas such as $N_2$ into the heating chamber 181 is started, whereby the inside of the heating chamber 181 is maintained in low oxygen-density atmosphere (for example, 50 ppm or less).

Thereafter, the lifting pins 187 are lowered, whereby the substrate W is placed close to the hot plate 183 and heat-treated in the low oxygen-density atmosphere (for example, 50 ppm or less). The heating temperature is, for example, 200° C. to 470° C. (a third predetermined temperature). In addition, in-plane uniformity is favorable because of heating by the hot plate 183 instead of heating by a heating furnace.

After heat treatment is completed, the ring shutter 186 and the second gate shutter 185 are lowered, and the lifting pins 187 are raised. At this time, feeding of inactive gas such as $N_2$ into the heating chamber 181 is stopped, and feeding of inactive gas such as $N_2$ into the cooling unit 182 is started, thereby maintaining the inside of the cooling chamber 182 in low oxygen-density atmosphere (for example, 50 ppm or less). Thereafter, the cooling plate 193 enters the heating chamber 181 to receive the substrate W from the lifting pins 187, and the lifting pins 187 are lowered.

Then, the cooling plate 193 is returned into the cooling treatment 182, the second gate shutter 185 is raised, and the substrate W is cooled in low oxygen-density atmosphere (for example, 50 ppm or less). The cooling temperature at this time is, for example, 200° C. to 400° C., and the substrate W is cooled in low oxygen-density atmosphere, thereby effectively preventing oxidation of the film. After completing the cooling, feeding of inactive gas such as $N_2$ into the cooling chamber 182 is stopped.

Thereafter, the second gate shutter 185 is lowered and the cooling plate 193 enters the heating chamber 181. Subsequently, the lifting pins 187 are raised, and the substrate W is returned onto the lifting pins 187 from the cooling plate 193. After carrying the substrate W out, the cooling plate 193 is returned into the cooling chamber 182 and the first gate shutter 184 is opened. Then, the substrate W is returned to the main carrier mechanism 118 (FIGS. 7 and 9). Thus, heating and cooling for curing the coating film are completed. Thereafter, the substrate W which finishes the layer insulating film is returned to the carrier station (CBS) 103 via the transfer section (TRS) 125 by means of the carrier mechanism 118.

Incidentally, the first, the second, and the third predetermined temperatures, heating times and the like are not limited to the above values. It is preferable, however, that the first heating temperature (the first predetermined temperature) is lower than the second heating temperature (the second predetermined temperature) and that the second heating temperature (the second predetermined temperature) is lower than the third heating temperature (the third predetermined temperature). The treatment is performed with the heat treatment temperature being raised stepwise up to the final heat treatment temperature. In addition, instead of the DCC treating unit, a heating furnace (not shown) which can heat a plurality of substrates W at the same time may be used.

As described above, the aforesaid SOD system is provided with treating units accordant with various coating methods, that is, the sol-gel process, the silking method, the speed filming method, and the foxing method. Therefore, a coating film according to each of the various coating methods can be formed in one system.

It should be mentioned that the present invention is not limited to the above embodiments, and various variations may be made.

As described above, according to the present invention, the substrate coated with the coating solution is heated at the first predetermined temperature, and after the above heating, through the non-heated process, the substrate is heated at the second predetermined temperature, or the process of heating the substrate coated with the coating solution and the process of putting the substrate in the non-heated state are repeated, thus gradually releasing the solvent in the coating solution, promoting drying of the coating solution without exerting a bad influence on the coating film, and effectively preventing the occurrence of transfer on the substrate.

Further, the heating temperature in the first heating process is made lower than that in the second heating process, thus holding down abrupt vaporization of the solvent in the coating solution to provide a more appropriate dried state and more effectively preventing the occurrence of transfer. The above difference in temperature can be realized by providing a low-temperature heating unit and a high-temperature heating unit both of which are different in set temperature, and by setting a space between the substrate and a heating plate in the first heating process larger than that in the second heating process.

What is claimed is:

1. A method of processing a substrate having a front surface and a back surface, comprising the steps of:
   (a) applying a coating solution including a solvent on the front surface of the substrate in order to form a coating film on the front surface of the substrate;
   (b) pre-baking the coating film after the step (a) has been completed, the pre-baking step including the steps of:
      (i) heating the substrate;
      (ii) cooling the heated substrate after the step (i) has been completed; and
      (iii) heating the substrate after the step (ii) has been completed; and
   (c) exposing and developing the coating film after the step (b) has been completed;
   (d) post-baking the coating film after the step (c) has been completed; and
   (e) placing the substrate in an atmosphere of reduced pressure after performing the step (a) and before performing the step (i), or after performing the step (i) and before performing the step (iii), wherein the heating steps (i) and (iii) are carried out by placing the substrate so that the back surface of the substrate faces a heating plate and is located in close proximity to the heating plate and that only a portion or portions of the substrate contacts a supporting member or members.

2. The method according to claim 1, wherein the substrate is heated at a first temperature in step (i), the substrate is heated at a second temperature in step (iii), and wherein the second temperature is higher than the first temperature.

3. The method according to claim 1, wherein the step (b) further including the step of:

(iv) repeating the steps (ii) and (iii) at least once after the step (iii) has been completed.

4. The method according to claim 1, further comprising the step of:

(e) gelatinizing the coating film after the step (a) and before the step (b).

5. The method according to claim 1, wherein the step (b) further including the step of:

(iv) gelatinizing the coating film after the step (i) and before the step (iii).

6. The method according to claim 1, further comprising the step of:

(e) applying a second solvent onto the coating film after the step (a) and before the step (b), thereby exchanging the first solvent included in the coating film for the second solvent.

7. The method according to claim 1, wherein the step (b) further including the step of:

(iv) applying a second solvent onto the coating film after the step (i) and before the step (iii), thereby exchanging the first solvent included in the coating film for the second solvent.

8. The method according to claim 1, further comprising the step of:

(e) removing at least a part of the coating film after the step (a) and before the step (b).

9. The method according to claim 1, wherein the step (b) further including the step of:

(iv) removing at least a part of the coating film after the step (i) and before the step (iii).

10. The method according to claim 2, wherein the step (i) and (iii) are carried out by means of a common heating device having a heating body, and wherein a distance between the substrate and the heating body in the step (i) is different from that in the step (ii).

* * * * *